United States Patent [19]

Hansen et al.

[11] Patent Number: 4,608,688
[45] Date of Patent: Aug. 26, 1986

[54] PROCESSING SYSTEM TOLERANT OF LOSS OF ACCESS TO SECONDARY STORAGE

[75] Inventors: Robert C. Hansen, Wheaton; Calvin J. Richardson, Naperville; David A. Schmitt, Glen Ellyn, all of Ill.

[73] Assignee: AT&T Bell Laboratories, Murray Hill, N.J.

[21] Appl. No.: 566,021

[22] Filed: Dec. 27, 1983

[51] Int. Cl.⁴ .............................................. G06F 11/16
[52] U.S. Cl. ...................................... 371/11; 364/200; 371/10
[58] Field of Search ........................... 371/9, 10, 11; 179/18 EE; 364/200, 900

[56] References Cited

U.S. PATENT DOCUMENTS

| | | | |
|---|---|---|---|
| 3,771,146 | 11/1973 | Cotton et al. | 364/200 |
| 3,882,455 | 5/1975 | Heck et al. | 371/9 |
| 4,051,461 | 9/1977 | Hashimoto et al. | 364/200 |
| 4,211,899 | 7/1980 | Ptacnik et al. | 179/18 EE |
| 4,356,550 | 10/1982 | Katzman et al. | 364/200 |
| 4,371,754 | 2/1983 | De et al. | 179/18 EE |
| 4,377,845 | 3/1983 | Markham et al. | 364/200 |
| 4,430,727 | 2/1984 | Moore et al. | 371/10 X |

FOREIGN PATENT DOCUMENTS 1369059  10/1974  United Kingdom .

OTHER PUBLICATIONS

Toy, Fault Tolerant Design of Local ESS Processors, Proceedings of the IEEE, vol. 66, No. 10, Oct. 1978, pp. 1126-1145.
Bacete et al., Stored Program Multiregister Control Software, Electrical Communication, vol. 54, No. 4, 1979, pp. 281-291.
A. H. Nolta et al., "Maintaining Cached DASD", IBM Technical Disclosure Bulletin, vol. 25, No. 2, Jul. 1982, pp. 823-824.
C. F. Ault et al., "Memory Systems", 1A Processor, The Bell System Technical Journal, vol. 56, No. 2, Feb. 1977, pp. 191-192.

Primary Examiner—Charles E. Atkinson
Attorney, Agent, or Firm—David Volejnicek

[57] ABSTRACT

In a processing system (100) that swaps processes between a main memory (114 or 124) and a pair of duplicated disks (132, 142), system processing capability is protected against loss of access to both system-essential duplicated disks. Upon loss of access to one duplicated disk, processes designed as essential to the system's operation and not resident in the main memory are swapped into the main memory from the other duplicated disk. All essential processes are then locked into the main memory to prevent their removal therefrom. Thus the essential processes remain accessible to the processing system even upon loss of access to both of the disks. Upon loss of access to both of the disks, the system may undergo reconfiguration in an attempt to regain access to at least one of the disks. If reconfiguration fails, non-essential processes are killed and the system continues processing using only the essential processes. Upon restoration of access to one of the disks, the restored disk is initialized from tape and the system is then bootstrapped from the restored disk, and normal processing is resumed. Upon restoration of access to the second disk, the second disk is repopulated from the first disk and the essential processes are unlocked from the main memory.

38 Claims, 10 Drawing Figures

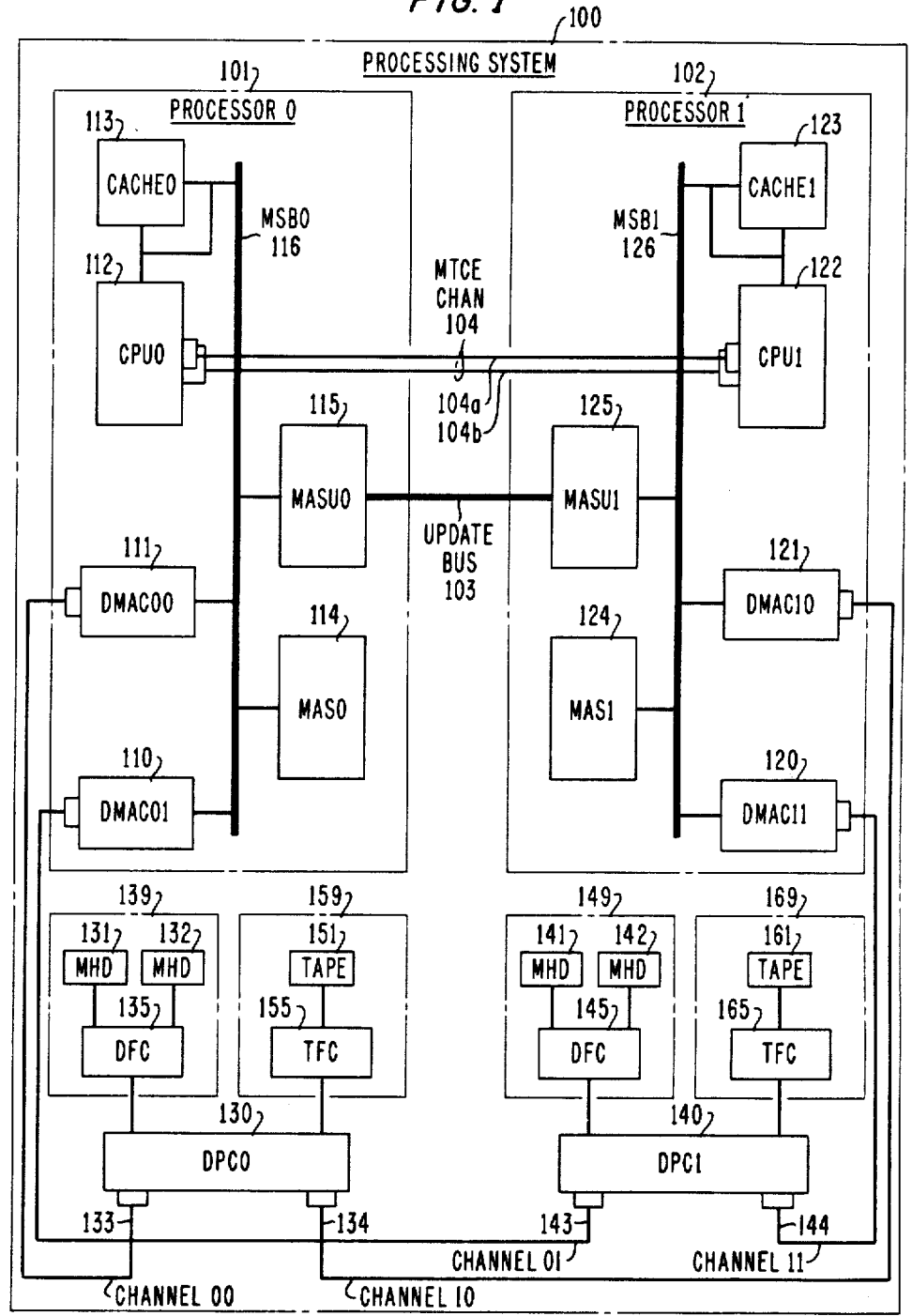

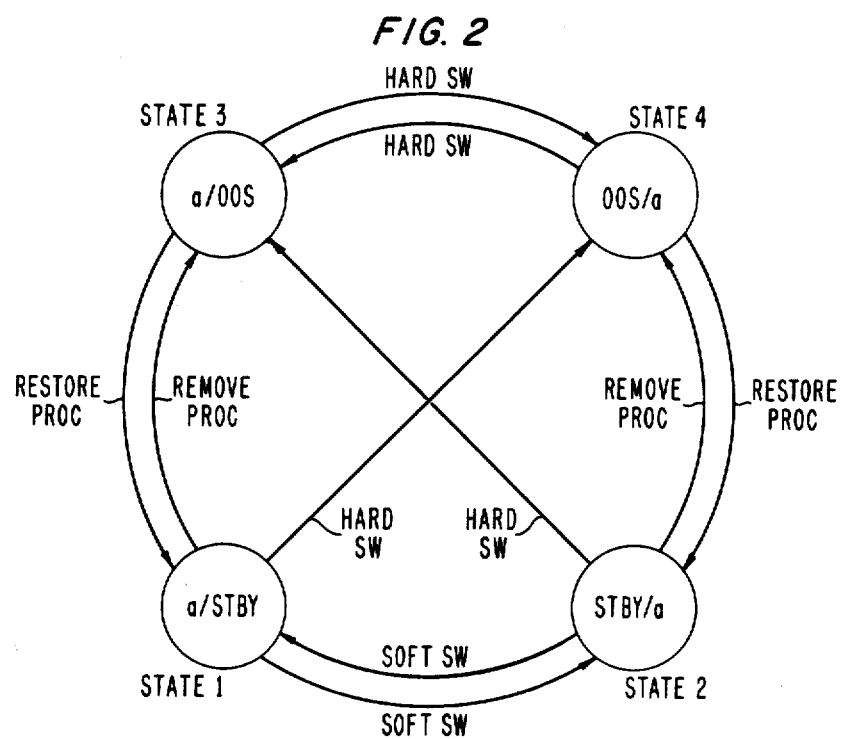

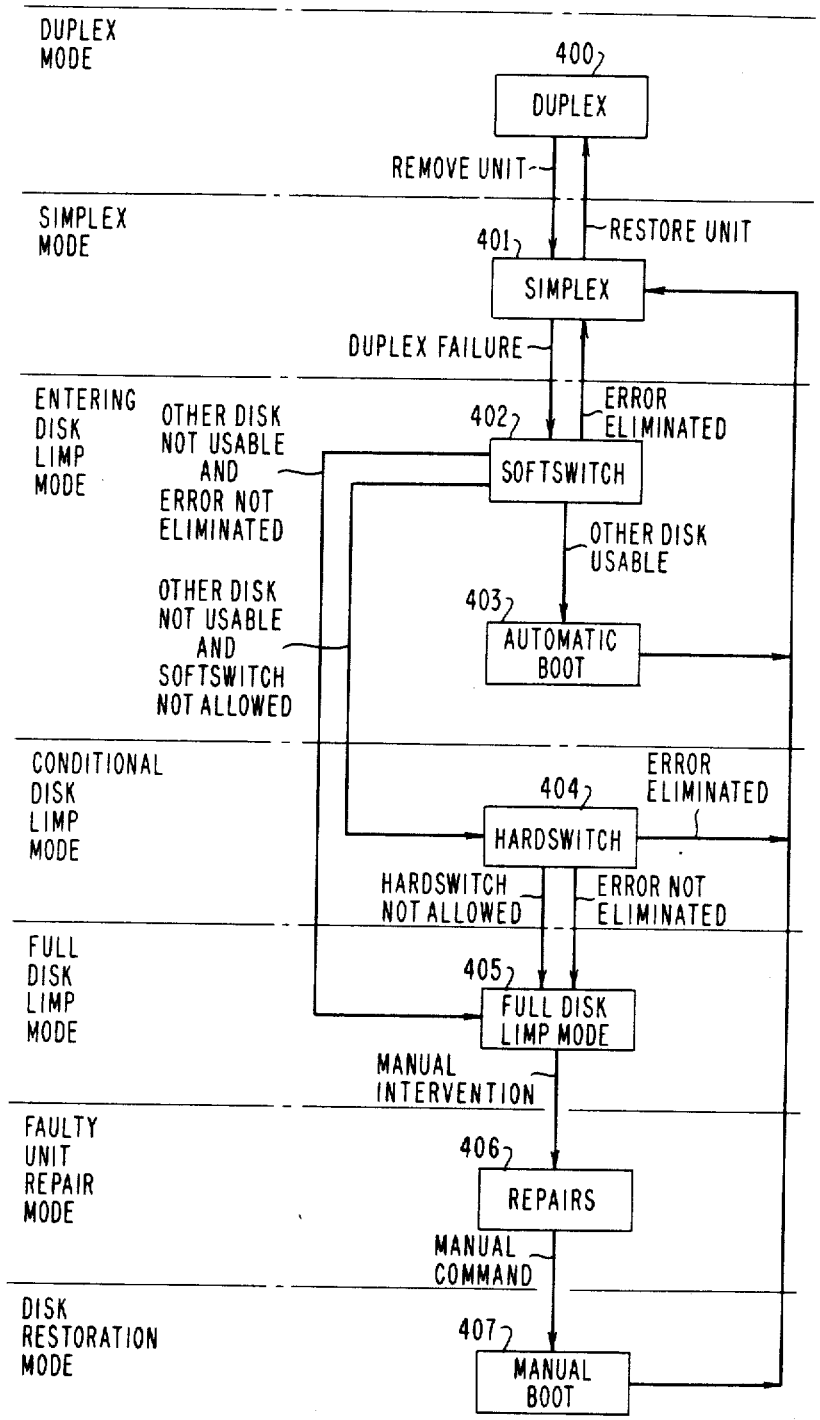

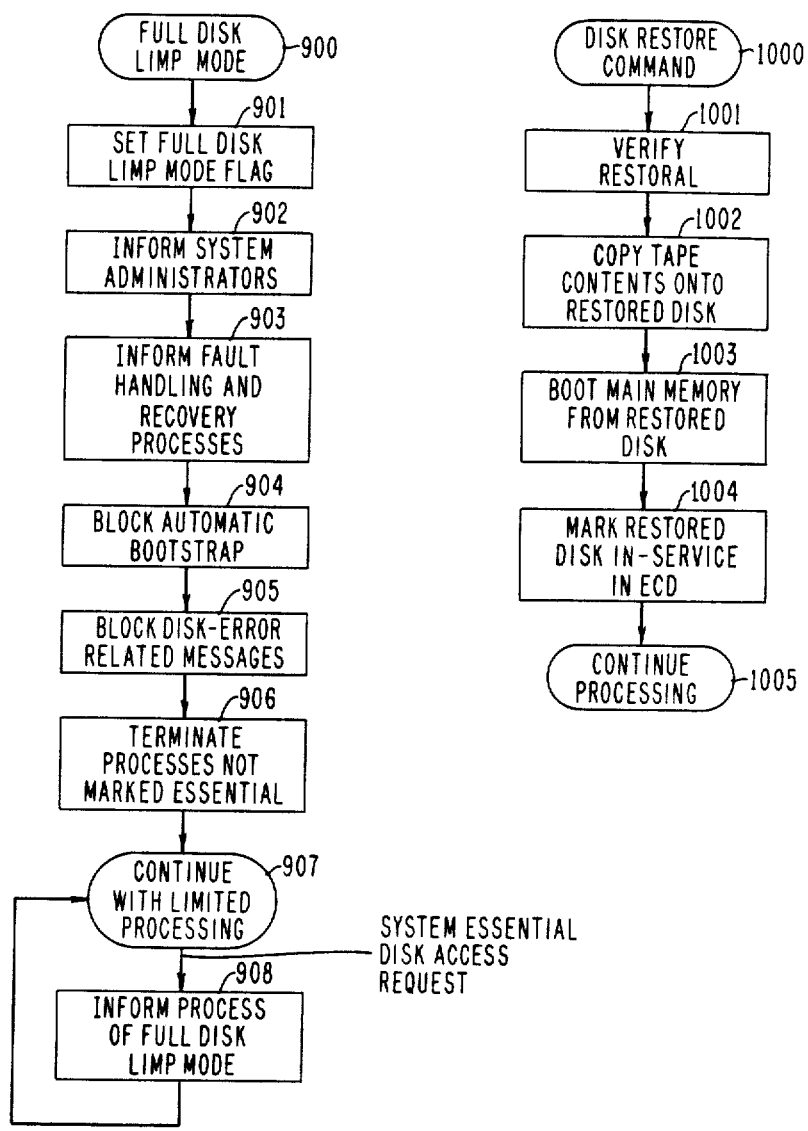

PROCESSING SYSTEM TOLERANT OF LOSS OF ACCESS TO SECONDARY STORAGE

TECHNICAL FIELD

This invention relates to fault-tolerant processing systems and in particular to such systems that include replicated secondary storage.

BACKGROUND OF THE INVENTION

Due to the cost and performance differences of various types of memory devices, processing systems typically use at least two types of memory. One type is the main memory, which is a relatively fast, randomaccess, memory, capable of being read or written substantially in real time. Generally implemented as a core or a semiconductor memory, the main memory is rather expensive per bit of storage space. Hence the main memory is commonly made only large enough to hold information that is likely to be needed by the processing system most immediately. The bulk of information available to the processing system is held in the other type of memory, referred to as secondary storage. Information is moved by the processing system between the main memory and secondary storage as needed.

Secondary storage is commonly implemented in a sequential access, magnetic storage medium, such as a tape or a disk. Compared to the main memory, access to the secondary storage is typically slow. However, the secondary storage is relatively inexpensive per bit of storage space, and hence it can provide large amounts of storage capacity to a processing system at reasonable cost.

There are many applications of processing systems— for example telephone electronic switching systems— that both require real-time processing and do not tolerate well the loss of processing capability. Processing systems used in such applications need to be highly reliable, to the point of being fault-tolerant. One way of achieving reliability and fault tolerance in processing systems is by duplication, or even more numerous replication, of the functional units in the system, including replication of the secondary storage units and their contents. Duplicated secondary storage may be arranged in an active-standby configuration, wherein the active storage unit is on-line and performing storage and retrieval tasks as required by the processing system, while the other unit is kept up to date with the same contents as the active unit and stands by, ready to take over as the active unit should the currently-active unit fail. Thus the system can generally tolerate the loss of one secondary storage unit without loss of processing power.

But even upon failure of all replicated secondary storage units in the processing system, processing capability of the system need not necessarily be totally lost. Some of the system's stored information is contained in the main memory, and this information may be sufficient to allow the system to continue to perform some of its tasks. Whether or not the processing system retains at least part of its processing capability in the face of loss of all of its replicated secondary storage units is then a function of what information remains available to it from other sources. For example, in certain electronic switching systems, information essential for system operation, such as most real-time intensive system and application programs and parameters, is permanently stored in a program store portion of the system's main memory, while other information, such as data about particular customers served by the system, is stored on duplicated disks and is brought into a call store portion of the main memory only when needed. Upon failure of both of its duplicated disks, the system retains access to its essential programs, and therefore retains the capability of performing those of its tasks and of servicing those of its customers for which or whom it either has the necessary data stored in call store or does not require any stored data.

The majority of processing systems, including many modern electronic switching systems, are not structured like the certain switching system just described. In particular, these processing systems differ from the described switching system in that they do not permanently store all of their essential programs and system parameters in main memory. Rather, processing systems commonly store most of their parameters, programs, and other information, in secondary storage such as disk storage and move this information back and forth between the main memory and the secondary stores as needed. The reasons for this are numerous. They include the utilization by these processing systems of sophisticated operating systems that are capable of moving the programs and other information efficiently between main memory and secondary storage; the cost savings resulting from not having to have a main memory large enough to store all programs executable by the processing system and still provide adequate storage space for other information that is desirably stored in the main memory; and the versatility of, and general purpose to which may be put, the processing system when it is not restricted to executing only the limited number and size of programs that can fit into its main memory.

But precisely because these systems move information essential to their operation back and forth between secondary storage and the main memory, they lose access to that information upon loss of access to the secondary storage. The loss of access to secondary storage may occur at any time, and the inaccessible information may be that without which the system cannot continue its processing activities. Hence processing systems generally lose their processing capability in the face of such secondary storage failure.

SUMMARY OF THE INVENTION

It is these and other disadvantages of prior art processing systems that the present invention is directed to solving. According to the invention, a processing system having replicated secondary storage, such as duplicated disks, for information, such as programs and data, needed for operation retains essential processing capability in the face of loss of the secondary storage. Upon loss of all but one, or at least one, replicated secondary store, designated information from the available secondary store is stored in and locked into the system's main memory, to ensure availability of this information to the system should all secondary storage be lost.

Upon loss of all of the replicated secondary storage, system operation is limited to use of the designated information locked into the main memory. Upon restoration of at least one of the replicated secondary stores, limitation of operation ceases, but the designated information remains locked into the main memory. Upon restoration of other replicated secondary storage, the designated information is unlocked in the main memory to allow removal thereof from the main memory.

Preferably, a processing system having replicated functional units in addition to the secondary stores attempts to reconfigure itself with the replicated functional units upon loss of some of the replicated secondary stores, in an attempt to restore the lost secondary storage.

Advantageously, a system according to this invention preserves at least some of its processing capability in the face of loss of even all of its replicated secondary storage. And this is true even in systems that store their essential information, including system and application programs essential to their operation, in the replicated secondary storage. Hence this invention is particularly suited to modern processing systems, such as those that operate under control of operating systems, which systems typically store their programs in secondary storage and swap them in and out of the main memory as needed during operation. The invention allows these processing systems to achieve fault-tolerance of a heretofore unachievable magnitude These and other advantages and features of the present invention will become apparent from the following description of an illustrative embodiment of the invention taken together with the drawing.

BRIEF DESCRIPTION OF THE DRAWING

FIG. 1 is a block diagram of an illustrative processing system embodying the invention;

FIG. 2 is a state diagram of the configurational states of the processing system of FIG. 1;

FIG. 3 is a diagram of a dispatcher control table of the processing system of FIG. 1;

FIG. 4 is a diagram of the disk-related operational modes of the processing system of FIG. 1;

FIG. 9. is a logic flow diagram of the transitions to the full disk limp mode block of the operational modes diagram of FIG. 4; and FIG. 10. is a logic flow diagram of the manual boot block of the operational modes diagram of FIG. 4.

DETAILED DESCRIPTION

A. System Configuration

Figure 5:
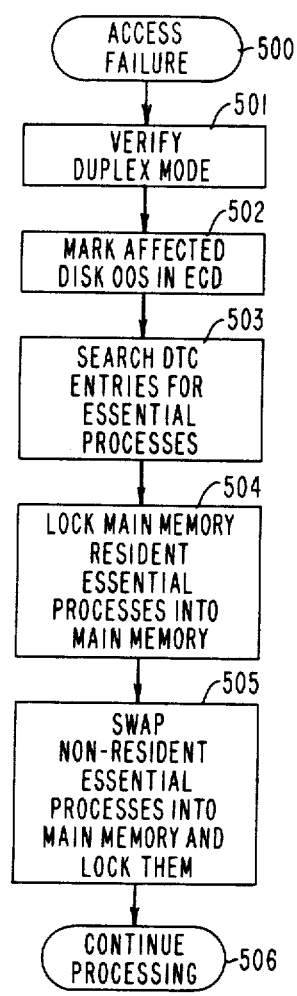
FIG. 5 is a logic flow diagram of the remove unit transition to the simplex block of the operational modes diagram of FIG. 4.

An illustrative embodiment of a processing system that incorporates the invention is shown in block diagram form in FIG. 1. Shown there is a dual processor system 100, which is suitably the 3B20D/UNIX-RTR computer system of AT&T Information Systems Inc. The system comprises the UNIX-RTR operating system executing on the 3B20D processor. The 3B20D/UNIX-RTR computer system is described in the Bell System Technical Journal, Vol. 62, No. 1, Part 2, of January, 1983. The Journal may be referred to for an understanding of the construction and operation of the 3B20D/UNIX-RTR computer system, but a brief description thereof will be given herein to illustrate the environment in which the invention functions.

The dual processor system 100 comprises a pair of processors 101 and 102. The processors 101 and 102 are substantially identical. In a conventional mode of operation, one of the processors 101 and 102 is active, operating under the control of the operating system to execute processes, also referred to as tasks, assigned for execution thereto, while the other of the processors 101 and 102 is conventionally idle, standing by and ready to become active should a fault place the active one of the processors 101 and 102 out of service. A process may be, for example, a user written program, or it may have a dedicated function, such as control of an input and output device or the creation and detection of other processes. A process is generally considered to include a private data space and register values, and a set of code, i.e., program instructions, that it possibly shares with other processes.

The main program execution, control, and data manipulation functions of the processor 101 are performed by a central processing unit (CPU) 112. The CPU 112 is a microprogrammed machine: most processor functions are carried out by execution of micro-instructions, stored in a microprogram store (not shown) internal to the CPU 112. Execution of sequences of micro-instructions implements operations dictated by program instructions. The CPU 112 generally obtains information that it requests, such as data and program instructions, from the main on-line memory facility of the processor 101, referred to as the main store (MAS) 114. Selected portions of both application and operating system processes are stored in the main store 114. For improved speed of operation, the CPU 112 may optionally be equipped wrth a cache 113 which serves as a high speed buffer for information transfers between the CPU 112 and the main store 114.

Communications between the main store 114 and devices such as the CPU 112 and the cache 113 proceed over a main store bus (MSB) 116 and are controlled by a main store update unit (MASU) 115 which arbitrates access to the main store 114. A pair of direct memory access controllers (DMACs) 110 and 111 also connects to the main store bus 116 to provide the facility of direct information transfers between the main store 114 and the periphery of the processor 101.

As the processors 101 and 102 are substantially duplicates of each other, the processor 102 similarly comprises a pair of DMACs 120 and 121, a CPU 122, a cache 123, a MAS 124, and a MASU 125 interconnected by a MSB 126.

The periphery of the processors 101 and 102 may comprise a variety of devices, most of which are determined by the application to which the processing system 100 is put. The peripheral devices include bulk storage facilities such as disk memory subsystems 139 and 149 and tape subsystems 159 and 169, shown in FIG. 1.

A first group of peripheral equipment devices comprising the subsystems 139 and 159 is connected to a dual port controller (DPC) 130. One communication port of the dual port controller 130 is connected to a communication channel 133 while the other port of the controller 130 is connected to a channel 134. The controller 130 selectively interfaces the subsystems 139 and 159 to one or the other of the channels 133–134, as dictated by directives received over the channels 133-134 The channel 133 connects to the DMA controller 111 and the channel 134 connects to the DMA controller 121, thus giving both processors 101 and 102 access to the subsystems 139 and 159. The DMACs 111 and 121 control transfers of information between the MASs 114 and 124 and the subsystems 139 and 159 in a conventional manner.

In a similar manner, a second group of peripheral equipment devices comprising the subsystems 149 and 169 is interfaced selectively to one of a pair of channels 143 and 144 by a dual port controller (DPC) 140. The channel 143 connects to the DMAC 110 while the channel 144 connects to the DMAC 120, to give both processors 101 and 102 access to the subsystems 149 and 169. The DMACs 110 and 120 also control transfers of information between the MASs 114 and 124 and the subsystems 149 and 169 in a conventional manner.

Each of the subsystems 139, 149, 159, and 169 comprises one or more bulk storage devices that provide the magnetic medium on which information is stored, and a controller that controls the operation of the subtending storage devices and interfaces them for communication to the communication channels in a known manner. In the disk memory subsystem 139, the storage devices are a plurality of moving head disks (MHDs) 131-132. The disks are controlled by a disk file controller (DFC) 135. Similarly, the disk memory subsystem 149 comprises a plurality of MHDs 141-142 under control of a DFC 145. In the tape subsystem 159, information is stored on tapes 151, which are controlled by a tape file controller (TFC) 155. In like manner, the tape memory subsystem 169 comprises tapes 161 and a TFC 165.

Some or all of the MHDs 131-132 of the subsystem 139 are duplicates of some or all of the MHDs 141-142 of the subsystem 149. MHDs are duplicates of each other when they both store copies of the same information. Two MHDs that duplicate each other are referred to as a duplicate pair of disks. Generally only one MHD of a duplicate pair of MHDs is needed in the system 100 at any one time. The other MHD of the duplicate pair acts as a spare. The MHDs of a duplicate pair are generally kept up to date with the same information so that loss of access to one MHD of a duplicate pair does not deprive the system 100 of information stored thereon and hence does not affect processing capability of the system 100.

Some or all of the tapes 151 and 161 may likewise duplicate each other. But because tapes 151 and 161 may be manually moved between the subsystems 159 and 169, generally there is no need for the tapes 151 and 161 to duplicate each other.

In a manner similar to that of duplicate disk pairs, to allow either one of the processors 101 and 102 to perform system tasks equally well and to substitute for each other should one of them fail, the contents of the main stores 114 and 124 need duplicate each other. For this purpose the main store update units 115 and 125 of the processors 101 and 102 are interconnected by a communication bus referred to as an update bus 103. The update bus 103 is controlled and used by the main store update units 115 and 125 in the following manner.

Aside from arbitrating access to the main store 114, the main store update unit 115 monitors the type of access being made to the main store 114. If the requested access is of the type tending to change the contents of the main store 114, for example, a write or a clear operation, and if the processor 102 is not out of service, the main store update unit 115 issues a request to the main store update unit 125 for access to the main store bus 126, as any other unit connected to the bus 126 might.

The main store update unit 125 processes the request as any other request for access to the bus 126. When the bus 126 becomes available, the main store update unit 125 signals a grant of access to the main store update unit 115 and connects its end of the update bus 103 to the main store bus 126.

In response to the grant signal, the main store update unit 115 connects its end of the update bus 103 to the main store bus 116 and allows the initially-requested access to the main store 114 to proceed. Because the buses 116 and 126 are now connected, the main store access is made over both buses 116 and 126 to both main store units 114 and 124, and the contents of the units 114 and 124 are changed in the same way. Following completion of the access, both main store update units 115 and 125 disconnect the update bus 103 from their respective main store buses 116 and 126.

With respect to main store accesses by the processor 102 that need to be made to both main stores 114 and 124, the above-described roles of the main store update units 115 and 125 are merely reversed.

A direct communication channel is also provided between the CPU 112 and the CPU 122. Referred to as a maintenance channel 104, it provides a control and communication bus for the purpose of diagnosing the offline, inactive, one of the processors 101 and 102 from the on-line, active, processor. The maintenance channel 104 also provides low-level maintenance control for fault recovery programs, so that a switch in processor activity can be carried out with no operational interference. In addition, other maintenance controls can be exerted by one of the processors 101 and 102 over the maintenance channel 104 to start an initialization sequence on the other processor or to stop program execution on the other processor. The maintenance channel 104 can receive micro-instructions from an external source and execute them. The maintenance channel 104 can also control processor buses and issue processor control signals. Hence, the maintenance channel 104 can exercise almost complete control over a processor and can provide enough access to diagnose the machine even if the micro-control is not operational. For reliability purposes, the maintenance channel 104 is likewise duplicated, comprising channels 104a and 104b.

Aided by the above-described hardware configuration of the dual processor system 100, the operating system of the dual processor system 100 allows the system 100 to selectively operate in one of a plurality of configurations and to become reconfigured in response either to commands given to the system 100 by its operators or to internally sensed conditions such as the occurrence of faults.

During operation, only one of the processors 101 and 102 is active and is executing all system tasks while the other processor is inactive. During normal system operation, the inactive processor is standing by, ready to take over as the active processor if called upon to do so. Generally following the occurrence of a failure in the active processor, the failing processor becomes the inactive processor and is taken out of service (OOS) such that it is no longer considered ready to take over as the active processor. After such a failure, the remaining processor will diagnose the failed processor to try and return the failed processor to the standby state.

Only one version of the operating system exists in the system 100, albeit duplicate copies of it are stored in the main stores 114 and 124 and the bulk storage subsystems 139, 149, 159, and 169. The single version of the operating system executes on whichever one of the two processors 101 and 102 happens to be active.

During operation, the system 100 may be in any one of four configurational states, which are diagramed in FIG. 2. In state 1 one of the processors 101 and 102 is active (a) and the other is standing by (STBY); in state 2 the operational states of the two processors are switched. In state 3 one of the processors 101 and 102 is active and the other is out of service (OOS); in state 4 the operational states of the two processors are switched. In response to operating conditions, such as the occurrence of faults, or in response to commands from system administrators, the system 100 may make transitions between the various configurational states.

Changes of state of configuration of the system 100 generally fall into two categories: hard changes and soft changes. Hard changes are those which entail some degree of system 100 initialization such that they cannot be made transparent to processes executing on the system 100. System initialization is a sequence of actions that must be taken to recover normal processing capability after encountering a fault. Hard changes generally result from the occurrence of hardware faults in an active processor that are of such magnitude that the affected processor is unable to continue operation and must be taken out of service. Hard changes may likewise result from an escalation of recovery attempts from faults that need not cause hard changes, but wherein attempts at recovery through soft changes have failed. Referring to FIG. 2, hard changes are transitions from the state 1 to the state 4, from the state 2 to the state 3, or between the states 3 and 4, referred to as "hard switch". Hard changes are also referred to as "stop and switch", because system operation is stopped on the currently-active processor and is switched over to the other processor.

Soft changes are those which do not entail system reinitialization, or entail initialization of such a nature that they can be made transparent to application processes executing on the system 100. They generally result from the occurrence of hardware faults that are not significant enough to cause a hard change, from the occurrence of software faults, and from externally-generated commands given to the system 100. Such soft state changes are, for example, changes between the states 1 and 2, referred to as "soft switch". Another soft change, from the state 3 to the state 1 or from the state 4 to the state 2, referred to as "restore processor", may occur either in response to an externally generated command or in response to a determination by system 100 diagnostic and fault recovery programs that the out-of-service processor is available to serve as a standby processor, ready to become active should the currently-active processor fail. And a soft change from the state 1 to the state 3 or from the state 2 to the state 4, referred to as "remove processor", may occur even in response to hardware faults that would cause a hard change in an active processor, but do not in this case because no processes that could be affected by the fault are executing on the standby processor. A processor may also be removed via a manual command.

For automatic reconfiguration in response to the detection of a fault the system 100 depends upon fault detection and recovery hardware and software. The fault detection and recovery mechanisms of the system 100 are described in the above-mentioned issue of the BSTJ, which may be referred to for a more comprehensive understanding thereof. But a brief description of these mechanisms will be given herein to illustrate the environment in which the invention functions within the system 100.

Fault detection circuitry and programs included in the system 100 are extensive. Fault detection hardware and software techniques include extensive use of local matching circuits, parity techniques on all buses, Hamming error correction on the main stores, cyclic redundancy codes on secondary memories, and numerous hardware and software sanity timers throughout the control units and peripherals. In addition, routine diagnostics are used to detect failures in the fault detection mechanisms themselves. Routine sanity checks are used to ensure that peripheral subsystems are healthy. Finally, system integrity checks catch problems that may not be caught by unique detectors.

When any of the fault detectors determine an error condition, an interrupt is registered in the affected processor 101 or 102. Interrupts caused by the most severe of the faults result in automatic hardware sequences, hard changes, that switch the activities to the unaffected processor. Less severe faults result in interrupts to the microcode and software charged with recovery of the system.

Fault recovery programs control fault detection and recovery for hardware and software. The hardware fault recovery programs receive hardware interrupts and control the recovery sequences that follow. Upon determining that a particular error is exceeding predetermined frequency thresholds, changes in the configuration of the system to a healthy state are made.

Software fault recovery programs are very similar in architecture to hardware fault recovery. Each major unit of software has associated with it fault detection mechanisms such as defensive checks and audits, error thresholds, and error recovery mechanisms such as failure returns, data-correcting audits, and reinitialization techniques. In addition, proper execution of processes is monitored to ensure that a process does not put itself into an infinite execution loop, does not excessively consume system resources such as message buffers, does not try to access memory outside of defined limits, and does not try to execute instructions that are not permitted to the process. Each process has reinitialization and recovery controls so that a recovery can be effected.

If recovery actions result in removal of hardware or software units from the system 100, diagnostic and audit programs are dispatched automatically to analyze the hardware and software problems that led to the removal.

Bootstrap and initialization routines provide a fundamental set of microcode and software-implemented actions for controlling processor initialization and thereby achieving recovery of normal processing capabilities. System initialization involves execution of a microcoded sequence of actions that are taken to recover normal processing after encountering a condition such as a fault. System initialization is initiated automatically by hardware or software recovery mechanisms or manual requests.

The initialization sequence, regardless of its source, has a common beginning in a hardware signal within a processor, referred to as a Maintenance Reset signal. The initialization sequence that is executed upon receipt of the Maintenance Reset signal is referred to as a Maintenance Reset Function (MRF). The interrupt resulting from the Maintenance Reset signal represents the highest priority microcode interrupt in the system 100. MRF leads to initialization of the processor in which it is called.

The system 100 follows a progressive initialization strategy to achieve recovery. The initialization action taken is matched to the severity of the fault to prevent unnecessary loss of processing ability. If a particular level of initialization is not successful in achieving recovery, then the level of initialization is escalated, if it is not already at the maximum level, until recovery is achieved.

Referring again to FIG. 1, it is cooperation between the hardware units and the operating system of the processing system 100 that make its memory scheme functional. The relevant features of the memory scheme are as follows.

The tape subsystems 159 and 169 are the rudimentary storage for the processing system 100. The subsystem 159 and 169 represent a tertiary level of storage in the processing system 100. They store the basic programs, data, control, and other information, including the operating system software, basic application programs, and system and application parameters, that the system 100 needs to become operational. Upon radical initialization of the system 100, for example, upon initial system power-up, the contents of the tapes 151 and 161 of the subsystems 159 and 169 are transferred i.e., copied, into and stored in the secondary storage of the system 100 which comprises disk memory subsystems 139 and 149, from whence they are available for use by the system 100 during operation. The transfer is accomplished through a conventional operation known as manual bootstrap.

While all of the MHDs 131–132 and 141–142 store information for use by the system 100, only one duplicate pair of disks—the MHDs 132 and 142 in this example—contain information that is essential to the operation of the system 100. The MHDs 132 and 142 are referred to as a system-essential duplicate pair of disks. The information they contain includes system information transferred from the tape subsystems 159 and 169: the operating system processes, information necessary for system initialization, diagnostic programs, and processes for interface with system administrators, among others.

MHDs other than the system-essential pair of MHDs 132 and 142 contain information relating to the application of the system 100, such as the application processes, system 100 customer billing information, and certain databases. Much of this information is also transferred to these disks from the tape subsystems 159 and 169. Application processes that are essential to the system 100 in performing the application to which it is put are referred to as essential application processes. MHDs that store essential application processes, in this example the MHDs 131 and 141, also form a duplicate pair of disks, referred to as an application-essential duplicate pair of disks.

The difference between essential and nonessential MHDs is that the system 100 is capable of continuing its operation without access to information stored on the non-essential MHDs but is not capable of operating without access to the essential information, stored on the essential MHDs.

What information is essential to system operation is largely a function of the application of the system 100. Essentiality of any piece of information must be determined by the programmers and administrators of the system 100, and an indication thereof stored with the information. For example, the process control information block of every process may include a field for designating whether or not the process is essential.

In addition to storing the system processes transferred thereto from the tape subsystems 159 and 169, the system-essential duplicate pair of MHDs 132 and 142 stores images of these processes and of other processes existing in the system 100. The images of processes are stored in an area of the MHDs 132 and 142 referred to as the swap space. Images of a process are the executing, or executable, versions thereof. An image comprises a copy of the process program code along with its own associated data and other information. An image of a process is created in response to a call to the process, and the image is destroyed once it executes to completion. Creation and destruction of process images is a function of the operating system. A process image is a process in its own right. Henceforth, no distinction will be made between a process and its images, and process images generally will be referred to simply as processes.

One of the first application processes initially executed by the system 100 is a process that makes calls to all essential application processes, thereby creating images of the essential application processes in the swap space of the system-essential duplicated pair of MHDs 132 and 142. The system 100 thus gains access to the essential application processes through the MHDs 132 and 142. As a consequence, the system 100 is capable of performing its intended application even without access to the application-essential duplicate pair of MHDs 131 and 141. The MHDs 132 and 142 are therefore the only disks that are truly essential to the operation of the system 100, and further discussion herein of the disk memory subsystems 139 and 149 will concentrate on the MHDs 132 and 142.

The MASs 114 and 124 form the primary storage of the system 100. The storage capacity of a MAS 114 or 124 is relatively small compared to that of a disk memory subsystem 139 or 149. The MASs 114 and 124 therefore store at any one time only a portion of the contents of the disk memory subsystems 139 and 149. Blocks of information are transferred, or swapped, from the disk memory subsystems 139 and 149 into the MASs 114 and 124 when the information is needed by a CPU 112 or 122 or some other system 100 unit. For example, a process or a portion thereof is swapped into the MASs 114 and 124 so that it can be executed.

To make room for information being swapped into the MASs 114 or 124, other blocks of information residing in the MASs 114 and 124 and not currently being used are swapped out from the MASs 114 and 124 into the disk memory subsystems 139 and 149. In particular, processes swapped out from the MASs 114 an 124 are stored in the swap space of the MHDs 132 and 142. Swapping of information into and out of the MASs 114 and 124 is controlled by a portion of the operating system referred to as a memory manager. Such processes are well known in the art.

Information transfers between the processors 101 and 102 and the disk memory subsystems 139 and 149 are initiated and administered by an operating system process referred to as a disk driver. The disk driver responds to requests to retrieve information from, or to store information in, the disk memory subsystems 139 and 149. The disk driver selects the devices that should carry out the information transfer, commands the requisite DMAC to carry out the information transfer, and responds to messages such as acknowledgments or error reports from the selected DMAC and the periphery that deal with the requested transfer. It is the disk driver that is responsible for either successfully completing the transfer, or informing the operating system of reasons why the transfer cannot be completed. Disk drivers are also known in the art.

Yet another operating system process, referred to as the process manager, creates, destroys, and keeps track of processes in the system 100. Process managers are likewise known in the art. The process manager keeps track of process with the help of a dispatcher control table (DCT) 300, illustrated in FIG. 3.

The DCT 300 resides in the MASs 114 and 124. It contains an entry 301 for each process that exists in the system 100. The process manager adds an entry to the DCT 300 when it creates a new process. The process manager removes a process' entry from the DCT 300 when it destroys that process. Each process' entry contains information about the process that is required by the operating system to properly administer this process. This information is stored in a plurality of fields. A process identifier (ID) field 302 identifies the process. A status field 303 indicates, inter alia, whether the process is resident in the MASs 114 and 124 or whether it is suspended, i.e., swapped out, on the MHDs 132 and 142. A type field 304 indicates whether or not the process has been designated essential. This information is obtained by the process manager at the creation of the process, for example from the process' process control block. And a lock field 305 indicates whether or not the process may be swapped out from the main memory. Other fields, not shown in FIG. 3, may also be included in the DCT 300.

B. System Operation

The system 100 as described is able to continue operating, albeit at a reduced level of capability, even after it has lost access to both of the system-essential duplicated pair of MHDs 132 and 142. To illustrate how the system 100 deals with loss of one or both of the MHDs of the system-essential pair of MHDs 132 and 142, primary reference is made to FIG. 4. FIG. 4 shows the modes of operation that the system 100 passes through, and the actions taken in those modes, as the system 100 tries to retain the maximum processing capability possible in the face of system-essential disk loss.

The system 100 is assumed to start out in a duplex mode of operation, represented by block 400, wherein both of the duplicated pair of essential MHDs 132 and 142 are accessible to the active one of the processors 101 and 102. The duplex mode is the normal mode of operation, even though it corresponds to any one of the configurational states 1–4 of FIG. 2. Assuming that the processor 101 is the active processor (state 1 or 3 of FIG. 2), information transfers take place as needed between the subsystems 139 and 149 and the MAS 114. If the inactive processor 102 is in a standby state (state 1 of FIG. 2) the MAS 124 is updated by the MASUs 115 and 125 with the same information as the MAS 114 to keep the contents of the MASs 114 and 124 duplicated. If the processor 102 is out of service (state 3 of FIG. 2), the MAS 124 ceases being updated.

In the duplex mode of block 400 of FIG. 4, the disk driver satisfies the memory manager's requests for retrieval and transfer to main memory of disk-stored information alternatively from the disk memory subsystem 139 and the subsystem 149 when the information is stored in a duplicated pair of MHDs, and from the appropriate subsystem 139 or 149 when the information is stored in a non-duplicated MHD. By alternatively exercising both subsystems 139 and 149 in the case of information retrieval from a duplicated MHD, the disk driver obtains up-to-date knowledge of whether or not both subsystems 139 and 149 continue to operate properly. The disk driver causes information designated by the memory manager for swapping out from the MAS 114 to be stored in swap spaces of both subsystems 139 and 149. The disk driver thus ensures that the information contents of both MHDs 132 and 142 remain the same.

The processor 101 may lose access to an MHD as a result of any number of conditions that affect the chain of functional units involved in accessing the MHD. For example, an MHD itself may become faulty, or its controlling DFC may fail, or the channel connecting the disk memory subsystem to the processor may fail, or the DMAC that is attempting the access may fail. The failure of access may be either a total failure or just an unacceptably high error rate. Access may also be lost because a unit may have its power turned off, or may be disconnected from the system 100.

Fault detection mechanisms inform the disk driver of occurrence of a fault in accessing the desired MHD. Depending upon what type of fault is indicated, the disk driver may reattempt the access to determine whether the failure was just a transient condition. When it determines that the desired MHD truly cannot be accessed, the disk driver informs that part of the operating system which is responsible for system configuration. In the case of a non-system-essential MHD, the operating system's configuration process removes the device or devices affected by the fault from service.

The steps undertaken in removing a system-essential MHD from service are diagramed in FIG. 5. Upon being notified by the disk driver of failure of access to the system-essential MHD, at block 500, the configuration process first determines that the other of the duplicated pair of system-essential MHDs 132 and 142 is not out of service, to confirm that this is a transition from the duplex mode, as suggested in block 501. Only then does the configuration process remove the device or devices affected by the fault from service, as suggested by block 502. An MHD that is placed out of service ceases being updated with information being swapped out of the MASs 114 and 124.

As indicated in the block 502, placing a unit out of service is accomplished by setting appropriate flags in the system's equipment configuration data base (ECD). As the name implies, the ECD (not shown) is a main memory-resident data base defining the configuration of the system 100, such as what equipment and options the system 100 is equipped with, how that equipment is configured, and what the communication and signaling procedures are among the equipment.

If a non-duplicated MHD is placed out of service, the loss of that MHD is merely noted in the ECD and the system 100 continues its operation, merely informing processes seeking information from that MHD that the MHD is inaccessible. And if a non-system-essential duplicated MHD, such as the MHD 131, is placed out of service, the disk driver merely causes the other MHD 141 of the duplicated pair to be accessed instead, and system operation continues unchanged, i.e., in the duplex mode of block 400 ot FIG. 4. Such is not the case, however, when a system-essential MHD, such as the MHD 132, is placed out of service or becomes inaccessible as a result of one of the other units linking it to the processor 101 being taken out of service. Rather, loss of access to the system-essential disk such as the MHD 132 sends the system 100 into a simplex mode of operation, represented by block 401 in FIG. 4.

As the system 100 is entering the simplex mode of block 401 from the duplex mode, the disk driver informs other parts of the operating system that access to one of the essential MHDs 132 and 142 has been lost. The system 100 administrators are notified of this condition. So is the process manager, whose subsequent operation is logically diagramed in blocks 503–505 of FIG. 5. As is suggested in block 503, the process manager responds to the notification by searching the DCT 300 (see FIG. 3), looking for all processes whose type fields 304 indicate that they are essential processes. The process manager sets the lock fields 305 of all memory-resident essential processes to the locked state, to prevent their being swapped out from the MAS 114, and thus locks these processes into the MAS 114, as suggested in block 504. If an essential process' status field 303 indicates that the process is currently not residing in the MAS 114 but is swapped out on disk, the process manager requests that the process be brought into and stored in the MAS 114, as suggested in block 505. In response to this request, the disk driver causes the other system-essential MHD, in this example the MHD 142, to be accessed in the regular manner and the requested process to be transferred into and stored in the MAS. The process manager then changes the status field 303 of that process accordingly and locks that process into the MAS 114, also as indicated in the block 505. The system 100 then continues normal operation, in the simplex mode 401 of FIG. 4, with use of the remaining MHD 142, as suggested in block 506 of FIG. 5. Hence, in the simplex mode of operation, all processes marked essential are locked into the MAS 114. This assures that the essential processes will be accessible to the system 100 even upon failure of access to both system-essential MHDs 132 and 142.

Figure 6:
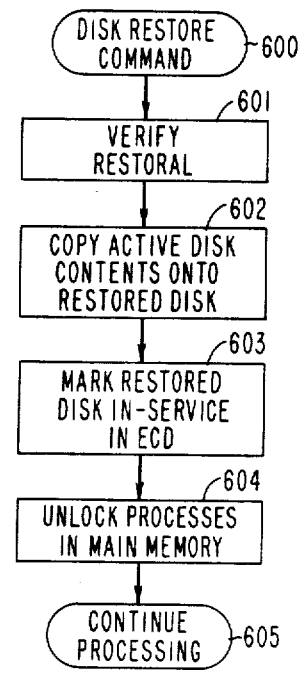
FIG. 6 is a logic flow diagram of the restore unit transition from the simplex block of the operational modes diagram of FIG. 4.

When system maintenance personnel eliminate the condition that caused the processor 101 to lose access to the system-essential MHD 132 and restore access capability to the MHD 132, system administrators give the system 100 a disk-restore command. The active processor—the processor 101 in this example—receives the command and responds thereto, in the manner shown in FIG. 6. In particular, detection of the restoral falls to the disk driver and the disk driver responds to the command with a test attempt at accessing the MHD 132 to verify that access to the MHD 132 has indeed been restored, as indicated in blocks 600–601. Should the test access fail, a message would be issued to the system administrators informing them of the continuing simplex condition. Upon successful completion of the test, the disk driver restores the contents of the newly-accessible MHD 132 to a usable state by repopulating the MHD 132 from the MHD 142. As indicated in block 602, repopulation is conventionally accomplished by copying contents of the MHD 142, which remained active and accessible, into the restored MHD 132 via DMA transfers of information from the MHD 142 to the MAS 114, and therefrom out to the MHD 132. Repopulation of the disk insures that the MHD 142 and MHD 132 once again duplicate each other, and that both have contents consistent with the contents of the MASs 114 and 124. The MHD 132 is thus restored to a fully operational state, and the disk driver notifies other parts of the operating system thereof.

Upon being informed that access to both disks has been restored, the configuration process changes the appropriate flags in the ECD to mark the MHD 132 as being in service, as indicated in block 603. And the process manager accesses the DCT 300 and sets the lock field 305 of the essential processes to the "unlocked" state, thus enabling the swapping of the processes from the MAS 114, as indicated in block 604. The system 100 thus reenters the duplex mode, at the block 400 of FIG. 4, and continues normal operation, as suggested in block 605 of FIG. 6.

If the processor 101 loses access to both MHD's of a non-system-essential duplicated pair of MHDs, the system 100 undergoes recovery actions, such as a switch of system activities from the processor 101 to the processor 102, in an attempt to regain access to at least one of that pair of MHDs. If unsuccessful in regaining access to at least one of those MHDs, the system 100 continues operations, and merely informs processes requesting information from the inaccessible MHDs that these MHDs cannot be accessed. If these disks happen to be the application-essential MHDs 131 and 141, the system also blocks automatic bootstrap from being initiated, as attempted bootstrap would only send the system into repeated, futile, recovery attempts. But with respect to the essential disks 132 and 142, the system 100 remains in the simplex mode at the block 401 of FIG. 4.

While the system 100 is in the simplex mode, access by the processor 101 to the other system-essential MHD 142 may fail as well. In the face of such duplex disk failure, the processor 101 loses access to both system-essential MHDs 132 and 142. Upon detecting the loss, the disk driver may reattempt access to the MHD 142 to determine whether the failure was just a transient condition. When satisfied that the MHD 142 truly cannot be accessed, the disk driver again informs the operating system configuration process of this condition. The configuration process determines whether the MHD 142 can be removed from service. Because duplex failure of the system-essential MHDs 132 and 142 has occurred and the replacement MHD 132 is not accessible, the configuration process determines that the MHD 142 cannot be removed from service. As a result, the system 100 finds itself entering disk limp mode, so called because the system 100 is "limping along" in its operations without access to either one of the duplicated pair of system-essential disks. The system 100 does continue to operate, however, albeit at a reduced level of computing capability.

While the system 100 is entering disk limp mode, the configuration process tries to reconfigure the system 100 in order to regain access by the system 100 to at least one of the system-essential MHDs 132 and 142. The configuration process initially requests a soft switch, as shown in block 402 of FIG. 4. The soft switch transfers processing from the active processor 101 to the standby processor 102 in a manner transparent to application processes and to input and output operations that are in progress. The soft switch process is logically diagramed in FIG. 7.

Figure 7:
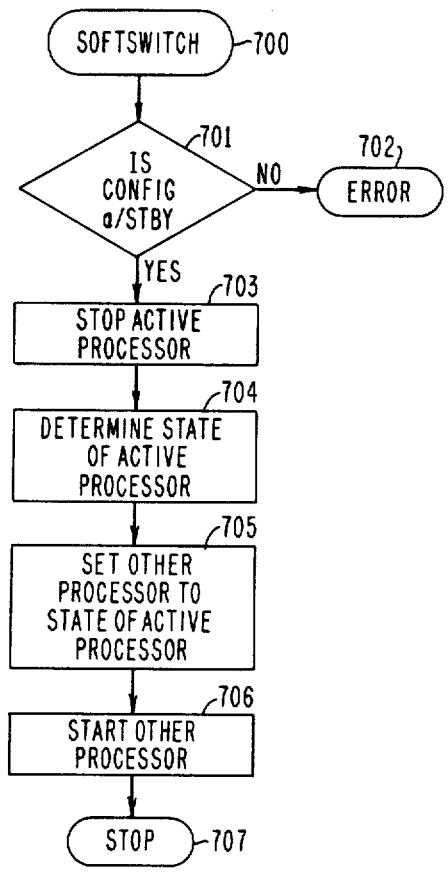
FIG. 7 is a logic flow diagram of the soft switch block of the operational modes diagram of FIG. 4.

Upon receipt of the soft switch request, at the block 700 of FIG. 7, the soft switch process accesses the ECD in the MAS 114 to determine if the system 100 configuration is active-standby, as shown in block 701. If not, the MAS 124 is not necessarily up to date with the MAS 114. Therefore the soft switch cannot be performed, and the soft switch process issues an error message to the configuration process, as indicated in block 702. If the system 100 configuration is in an active-standby configuration, however, the soft switch process stops execution of normal tasks by the active processor 101, as indicated in block 703. The soft switch process then accesses status registers of the active processor 101 to determine its internal processor state, as shown in block 704. Once the internal processor state of the active processor 101 is determined, the maintenance channel 104 is utilized to set the other processor 102 to that internal processor state, as indicated in block 705. The active processor 101 then commands the maintenance channel 104 to start the other processor 102, as indicated in block 706. The other processor 102 takes over normal system processing activity from the point at which the formerly-active processor 101 stopped, and the processor 101 stops, as suggested in block 707, and assumes the standby state.

Because the soft switch puts the processor 102 into the same internal state as the processor 101, the processor 102 attempts the same disk access that failed on the processor 101. That means that the processor 102 attempts to access the same MHD, the MHD 142 in this example, albeit over a different channel and using a different DMAC from that used by the processor 101. If the access is successful, it indicates that the soft switch succeeded in eliminating the errors which caused that access to fail on the other processor 101. The system 100 therefore resumes the simplex mode of operation, at the block 401 of FIG. 4. In this mode the processor 102 continues normal system processing activities with use of the MHD 142.

Still referring to FIG. 4, if the soft switch did not succeed in eliminating the errors which caused access of the MHD 142 to fail on the processor 101, when that same access is retried by the processor 102, it fails as well. In response to the failure, the disk driver checks the usability, including accessibility, of the other essential MHD 132 and the associated DFC 135. In spite of being marked out of service, the MHD 132 and the DFC 135 are considered usable if they are accessible and not powered down, if they are not faulty, and if at least one restoral of them has been initiated and completed successfully at some prior time.

If the MHD 132 and the DFC 135 are determined to not be usable, the configuration process is notified, and it responds by setting a flag in the ECD indicating that the system 100 is in full disk limp mode of operation, at the block 405.

If the MHD 132 and the DFC 135 are determined to be usable, the system 100 can operate using the MHD 132. However, because the MHD 132 has been marked out of service, it has not been updated with the same information from the MASs 114 and 124 as the MHD 142. Therefore, before the MHD 132 can be used, the contents of the MAS 124 must be made consistent with the contents of the MHD 132. To achieve this, the MAS 124 is automatically booted from the MHD 132, as indicated in the block 403. The automatic bootstrap involves replacing the versions of processes stored in the MAS 124 with copies of the processes as they exist the MHD 132. However, the ECD and protected application segments (PASs) of processes are saved in the MAS 124. A PAS is a segment of memory assigned to a process in which a process typically saves information crucial to its recovery.

Following the automatic bootstrap, the system 100 resumes the simplex mode of operation, at the block 401. In this mode the processor 102 continues normal system processing activities with use of the MHD 132. From the simplex mode, the system 100 can return to the duplex mode of block 400 in the manner discussed previously, in conjunction with FIG. 6.

Alternatively, if the soft switch does not succeed, instead of first checking usability of the MHD 132 and the DFC 135, the system 100 may enter directly into full disk limp mode, described below.

As was mentioned above, a soft switch is allowed to occur only if the system 100 is in an active-standby configuration, and if the system 100 is in any other configuration, a call to the soft switch process returns an error message to the configuration process. The disk driver is notified of the error, and it responds by checking the usability of the other system-essential MHD 132 and its DFC 135, in the manner that was described above. If the MHD 132 and its DFC 135 are determined to be usable, the system 100 can operate using the MHD 132. But, for reasons given above, the MAS 114 must be automatically booted from the MHD 132, again as indicated in the block 403. Following the automatic bootstrap, the system 100 resumes simplex operation at the block 401. In this mode, the processor 101 continues normal system processing activities with the use of the MHD 132. Once more, the system 100 can return to the duplex mode from the simplex mode in the manner discussed previously in conjunction with FIG. 6.

Alternatively, if the soft switch is not allowed, instead of first checking usability of the MHD 132 and the DFC 135, the system 100 may enter directly into conditional disk limp mode, described below.

If the soft switch is not allowed, and if the MHD 132 and the DFC 135 are checked and found to be unusable, the system 100 assumes conditional disk limp mode of operation. Like entering disk limp mode, conditional disk limp mode is a mode in which the system 100 tries to reconfigure itself in order to regain access to at least one of the system-essential MHDs 132 and 142. In the conditional disk limp mode, the configuration of the system 100 is an active/out-of-service state of FIG. 2; otherwise the soft switch would have been allowed at the block 402 of FIG. 4. Hence, to transfer system activities from the processor 101 to the processor 102, the system configuration process requests a hard switch from the processor 101 to the processor 102. The hard switch takes the system 100 from an active/out-of-service configuration to an out-of-service/active configuration of FIG. 2. The hard switch process is logically diagramed in FIG. 8.

Figure 8:
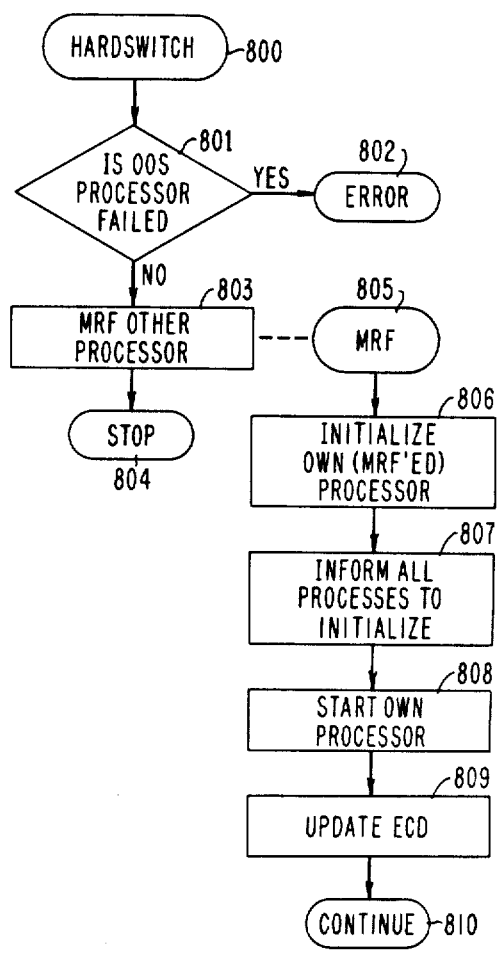
FIG. 8 is a logic flow diagram of the hard switch block of the operational modes diagram of FIG. 4.

Upon receipt of the hard switch directive at the block 800 of FIG. 8, the hard switch process accesses the ECD in the MAS 114 to determine if the processor 102 is marked as failed, as indicated in block 801. If so, processing activity cannot be switched to the processor 102, and the hard switch process issues an error message to the configuration process, as indicated in block 802. The configuration process responds by setting a flag in the ECD indicating that the system 100 is in full disk limp mode of operation of block 405. But if the processor 102 is not marked as failed, the hard switch process causes the maintenance channel 104 to call MRF on the other processor 102, as indicated in block 803. The hard switch process then stops the active processor 101, as shown in block 804.

Upon receipt by the processor 102 of the Maintenance Reset signal, at the block 805, the MRF sequence begins to execute thereon. The MRF sequence initializes the processor 102 on which it was called, as indicated in block 806. The MRF sequence also takes steps, such as setting proper indicators, to cause all processes to initialize before executing, as indicated in block 807. As culmination of the execution of the MRF sequence, process execution by the processor 102 on which MRF was called is started, as suggested in block 808. Executing on the now-active processor 102, the hard switch process enters the ECD in the MAS 124 to store therein information indicating the current system configuration and marking the now-inactive processor 101 as out of service, as indicated in block 809. The now-active processor 102 then continues normal system processing activity, as indicated in block 810, resuming execution of processes at the point dictated by the initialization.

Resumption of normal system processing activity eventually leads the processor 102 to attempt system-essential disk access. Because the MHD 132 is still marked out of service in the ECD, disk access is again attempted to the MHD 142, albeit over a different channel and using a different DMAC from those that had been used by the processor 101. If the access is successful, it indicates that the hard switch succeeded in eliminating the errors which caused that access to fail on the other processor 101. The system 100 therefore resumes the simplex mode of operation, at the block 401 of FIG. 4. In this mode the processor 102 continues normal system processing activities with use of the MHD 142.

If the hard switch did not succeed in eliminating the errors which caused access of the MHD 142 to fail on the processor 101, when the access of the MHD 142 is tried by the processor 102, it fails as well. The configuration process is notified of the failure, and it responds by setting a flag in the ECD to indicate that the system 100 is in full disk limp mode of operation at the block 405 of FIG. 4.

As was mentioned above, full disk limp mode of operation is entered by the system 100 upon failure of a soft switch or a hard switch to restore access to a system-essential MHD, or when a soft switch or a hard switch is not allowed. Alternatively, the system 100 need not pass through entering disk limp mode and conditional disk limp mode, but may go to full disk limp mode directly from simplex mode of block 401 upon duplex system-essential disk failure.

In full disk limp mode, access from either processor 101 or 102 to either system-essential MHD 132 or 142 is impossible or not allowed. Only repair of the faulty units followed by a manual bootstrap can restore normal system operation. The system 100 does continue to operate, albeit at a reduced level of computing capability.

Steps taken by the system 100 in making the transition to the full disk limp mode are logically diagramed in FIG. 9. As was previously mentioned, when notified of full disk limp mode, at block 900, the configuration process sets a full disk limp mode-indicating flag in the ECD, as indicated in block 901. In response, system administrators are notified that full disk limp mode is in effect, as suggested in block 902. Likewise, system fault handling and recovery processes are notified of full disk limp mode, as suggested in block 903, so that any necessary recovery can take place. Notification also serves the function of preventing automatic bootstrap from being initiated by the recovery processes, as suggested in block 904. At this point automatic bootstrap would not recover the system, but would lead to repeated recovery attempts, thereby destroying all system processing activity. Also, output of disk error-related messages to system administrators is blocked, as indicated in block 905. Since system administrators have been notified of full disk limp mode, such messages would serve no useful function, but rather would tend to hide in their midst messages regarding other conditions that the system 100 may encounter.

The process manager and disk driver are also made aware of entry into full disk limp mode. The process manager responds by terminating, i.e., destroying, in the MAS 114 all processes that are not marked essential in the DCT 300, as indicated in block 906. The active one of the processors 101 and 102 then continues limited processing, as suggested in block 907, executing the essential processes in the normal manner. Execution of the essential processes may involve use of information that is available to the system 100 from resources other than the MHDs 132-142, for example, information available from other MHDs, or data obtained from other peripheral equipment units. However, should any essential process request information requiring access to one of the MHDs 132 or 142, the disk driver will notify the process that the system-essential disks cannot be accessed and that full disk limp mode is in effect, as indicated in block 908, so that the process may recover and cease making system-essential disk access requests.

When system administrators and maintenance personnel undertake repairs of the system 100, the system 100 enters faulty unit reparation mode of operation, at the block 406 of FIG. 4. In this mode, system 100 operation continues as in the full disk limp mode of block 405, but in addition the system service personnel call upon the system 100 to execute utility processes, which are included among the essential processes, to help determine which system units are faulty, to help determine the nature of the faults, to help make the necessary repairs, and to check the effectiveness of those repairs.

When repairs have been made to permit access to at least one of the system-essential MHDs 132 and 142, system restoration can take place. The system 100 is given a manual boot command, sending the system 100 into disk restoration mode, at the block 407 of FIG. 4. System activities in the disk restoration mode are diagramed in FIG. 10. Since non-essential processes have been destroyed in the main memory, and processing has continued without updating of the system-essential MHDs 132 and 142, the contents of the main memory and of the system-essential disks are incomplete and inconsistent with each other. Hence, in the disk restoration mode, the system 100 must undergo reinitialization from a tape subsystem 159 or 169. The tape subsystems contain an initial, i.e., initialized, version of processes, which must be loaded into the system-essential disks and the main memory to permit the system to resume full normal operation. The appropriate one of the tape subsystems 159 or 169 for reinitializing the system 100, for example the subsystem 159, is specified by system administrators as part of the manual boot command. As part of the response to the command, the restoral of the essential MHD 132 that subtends the same DPC 130 as the selected subsystem 159 is verified, and the restored MHD 132 is reloaded with a copy of the information from the tape 151 and is thus reinitialized, as indicated in blocks 1000-1002. Then the MASs 114 and 124 are bootstrapped from the newly-initialized MHD 132, as indicated in block 1003. A fresh copy of all information is swapped from the MHD 132 into the main memory. The ECD and PASs in the MASs 114 and 124 are not saved. As part of the bootstrap of the MASs 114 and 124, the flag in the ECD that indicates that full disk limp mode is in effect is cleared. In response, the system 100 resumes the simplex mode of operation, at the block 401 of FIG. 4. The restored MHD 132 is marked in the ECD as being in service, as indicated in block 1004 of FIG. 10. The system then continues its processing activities in the simplex mode, as suggested in block 1005. From this mode, full duplex mode of the block 400 may be entered in the manner described earlier in conjunction with FIG. 6.

Of course, various changes and modifications to the illustrative embodiment described above will be apparent to those skilled in the art. For example, disks need not be merely duplicated but may be replicated even more extensively. Or there may be more than one set of replicated system-essential disks and each set may be treated by the system in the above-described manner. Or the secondary memory subsystem need not be a disk subsystem but may be some other memory subsystem, for example a drum or a tape. As well, each of a replicated set of essential secondary stores need not be connected to a processor over a dedicated channel or by a dedicated DMAC; rather, the stores may have these facilities in common. Furthermore, the processing system embodying the invention need not be a dual processor system, but may be as well either a uniprocessor or a multiprocessor system. And each processor in a processing system that embodies the invention need not have a dedicated main store unit, but rather the processors may share a single main store.

Such changes and modifications can be made without departing from the spirit and the scope of the invention and without diminishing its attendant advantages. It is therefore intended that such changes and modifications be covered by the following claims.

What is claimed is:

1. In a processing system that includes
   a plurality of secondary memory means each storing a replica of information for use by the processing system, including designated information,
   main memory means for storing selected portions of the information, and
   means for transferring portions of the information between the main memory means and the secondary memory means,
   a method of protecting at least some system operating capability against loss of information transfer of secondary capability between the main memory means and the plurality memory means, comprising the steps of:
   detecting loss of information transfer capability between the main memory means and all but at least one of the secondary memory means;
   in response storing all designated information in the main memory means; and
   preventing removal of the designated information from the main memory means while permitting information transfer between the main memory means and the at least one secondary memory means and prior to loss of information transfer capability between the main memory means and the at least one secondary memory means;
   whereby the designated information remains available to the process system in the main memory means upon loss of information transfer capability between the main memory means and the plurality of secondary memory means.

2. The method of claim 1 wherein the step of storing all designated information in the main memory means comprises the step of:
   transferring such designated information as is not stored in the main memory means from the at least one secondary memory means into the main memory means.

3. In a processing system that includes
   a plurality of secondary memory means each storing a replica of information for use by the processing system, including designated information,
   main memory means for storing selected portions of the information, and
   means for transferring portions of the information between the main memory means and the secondary memory means,
   a method of protecting at least some system operating capability against loss of information transfer capability between the main memory means and the plurality of secondary memory means, comprising the steps of:
   detecting loss of information transfer capability between the main memory means and all but at least one secondary memory means;
   in response storing all designated information in the main memory means;
   preventing removal of the designated information from the main memory means to maintain the designated information available to the processing system in the main memory means upon loss of information transfer capability between the main memory means and the plurality of secondary memory means;
   detecting restoral of information transfer capability between the main memory means and at least two secondary memory means; and
   in response enabling removal of the designated information from the main memory means.

4. In a processing system that includes
   a plurality of secondary memory means each storing a replica of information for use by the processing system, including designated information,
   main memory means for storing selected portions of the information, and
   means for transferring portions of the information between the main memory means and the secondary memory means,
   a method of protecting at least some system operating capability against loss of information transfer capability between the main memory means and the plurality of secondary memory means, comprising the steps of:
   detecting loss of information transfer capability between the main memory means and all but at least one secondary memory means;
   in response storing all designated information in the main memory means;
   preventing removal of the designated information from the main memory means to maintain the designated information available to the processing system in the main memory means upon loss of information transfer capability between the main memory means and the plurality of secondary memory means;

detecting loss of information transfer capability between the main memory means and all of the secondary memory means; and in response limiting system operation to use of the designated information.

5. The method of claim 4 further comprising the steps of:

detecting restoral of information transfer capability between the main memory means and at least one secondary memory means; and in response ceasing limitation of system operation while keeping the designated information prevented from removal from the main memory means.

6. The method of claim 5 further comprising the steps of:

detecting restoral of information transfer capability between the main memory means and at least two secondary memory means; and in response enabling removal of the designated information from the main memory means.

7. In a processing system that includes a pair of secondary memory subsystems each storing a copy of data and programs for use by the processing system, including data and programs designated essential to system operation, a main memory for storing selected ones of the data and programs, and control means for transferring data and programs between the main memory and the secondary memory subsystem, a method of protecting system processing capability against loss of data and program transfer capability between the main memory and both secondary memory subsystems, comprising the steps of:

detecting loss of data and program transfer capability between the main memory and one of the secondary memory subsystems;

in response transferring such designated data and programs as are not stored in the main memory from the other of the secondary memory subsystems into the main memory; and locking the designated data and programs into the main memory to prevent their removal from the main memory while permitting transfer of data and programs between the main memory and the other of the secondary memory subsystems and prior to loss of transfer capability between the main memory and the other of the secondary memory subsystems;

whereby the designated programs and data remain available in the main memory to the processing system to continue processing therewith should data and program transfer capability between the main memory and both of the secondary memory subsystems be lost.

8. In a processing system that includes a pair of secondary memory subsystems each storing a copy of data and programs for use by the processing system, including data and programs designated essential to system operation, a main memory for storing selected ones of the data and programs, and control means for transferring data and programs between the main memory and the secondary memory subsystems, a method of protecting system processing capability against loss of data and program transfer capability between the main memory and both secondary memory subsystems, comprising the steps of:

detecting loss of data and program transfer capability between the main memory and one of the secondary memory subsystems;

in response transferring such designated data and programs as are not stored in the main memory from the other of the secondary memory subsystems into the main memory;

locking the designated data and programs into the main memory to prevent their removal from the main memory to maintain the designated programs and data available in the main memory to the processing system to continue processing therewith should data and program transfer capability between the main memory and both of the secondary memory subsystems be lost;

detecting restoral of data and program transfer capability between the main memory and both of the secondary memory subsystems; and in response unlocking the designated programs and data in the main memory to enable their transfer from the main memory.

9. The method of claim 8 wherein the step of unlocking is preceded by the step of:

in response copying data and programs stored by the other of the secondary memory subsystems into the one of the secondary memory subsystems.

10. In a processing system that includes a pair of secondary memory subsystems each storing a copy of data and programs for use by the processing system, including data and programs designated essential to system operation, a main memory for storing selected ones of the data and programs, and control means for transferring data and programs between the main memory and the secondary memory subsystems, a method of protecting system processing capability against loss of data and program transfer capability between the main memory and both secondary memory subsystems, comprising the steps of:

detecting loss of data and program transfer capability between the main memory and one of the secondary memory subsystems;

in response transferring such designated data and programs as are not stored in the main memory from the other of the secondary memory subsystems into the main memory;

locking the designated data and programs into the main memory to prevent their removal from the main memory to maintain the designated programs and data available in the main memory to the processing system to continue processing therewith should data and program transfer capability between the main memory and both of the secondary memory subsystems be lost;

detecting loss of data and program transfer capability between the main memory and both of the secondary memory subsystems; and in response limiting processing to execution of the designated programs, using the designated data and selectively other data available from sources other than the secondary memory subsystems.

11. The method of claim 10 further comprising the steps of:

detecting restoral of data and program transfer capability between the main memory and a first of the secondary memory subsystems; and in response ceasing limitation of processing while keeping the designated data and programs locked in the main memory.

12. The method of claim 11 wherein the step of ceasing limitation of processing is preceded by the steps of:

in response copying into the first of the secondary memory subsystem's an initial version of the data and programs from a tertiary memory subsystem included in the processing system; and replacing the version of the designated data and programs in the main memory with the initial version of the designated data and programs from the first of the secondary memory subsystems.

13. The method of claim 11 further comprising the steps of:

detecting restoral of data and program transfer capability between the main memory and both of the secondary memory subsystems; and in response unlocking the designated programs and data in the main memory to enable their transfer from the main memory.

14. The method of claim 12 further comprising the steps of:

detecting restoral of data and program transfer capability between the main memory and both of the secondary memory subsystems;

in response copying the data and programs stored by the first of the secondary memory subsystems into the second of the secondary memory subsystems; and unlocking the designated data and programs in the main memory to enable their transfer from the main memory.

15. In a processing system that includes a first and a second disk memory each storing a copy of processes for use by the processing system, including processes designated essential to system operation, a main memory for storing selected processes requested by the processing system for use, a first controller for accessing the first disk memory to swap processes between the main memory and the first disk memory, and a second controller for accessing the second disk memory to swap processes between the main memory and the second disk memory, a method of protecting system processing capability against loss of access to both disk memories, comprising the steps of:

detecting loss of access to the first disk memory;

in response swapping such of the essential processes as are not stored in the main memory from the second disk memory into the main memory; and locking the essential processes into the main memory to prevent their removal from the main memory while permitting access to the second disk memory and prior to loss of access to the second disk memory;

whereby the essential processes remain accessible in the main memory to the processing system upon loss of access to both disk memories.

16. In a processing system that includes a first and second disk memory each storing a copy of processes for use by the processing system, including processes designated essential to system operation, a main memory for storing selected processes requested by the processing system for use, a first controller for accessing the first disk memory to swap processes between the main memory and the first disk memory, and a second controller for accessing the second disk memory to swap processes between the main memory and the second disk memory, a method of protecting system processing capability against loss of access to both disk memories, comprising the steps of:

detecting loss of access to the first disk memory;

in response swapping such of the essential processes as are not stored in the main memory from the second disk memory into the main memory;

locking the essential processes into the main memory to prevent their removal from the main memory to maintain the essential processes accessible in the main memory to the processing system upon loss of access to both disk memories;

receiving notice of restoral of access to both disk memories;

in response copying contents of the second disk memory into the first disk memory; and unlocking the essential processes in the main memory to enable their removal from the main memory.

17. In a processing system that includes a first and a second disk memory each storing a copy of processes for use by the processing system, including processes designated essential to system operation, a main memory for storing selected processes requested by the processing system for use, a first controller for accessing the first disk memory to swap processes between the main memory and the first disk memory, and a second controller for accessing the second disk memory to swap processes between the main memory and the second disk memory, a method of protecting system processing capability against loss of access to both disk memories, comprising the steps of:

detecting loss of access to the first disk memory;

in response swapping such of the essential processes as are not stored in the main memory from the second disck memory into the main memory;

locking the essential processes into the main memory to prevent their removal from the main memory to maintain the essential processes accessible in the main memory to the processing system upon loss of access to both disk memories;

detecting loss of access to both disk memories; and in response limiting processing to the execution of the essential processes, including terminating processes not designated essential stored in the main memory.

18. The method of claim 17 further comprising the steps of:

receiving notice of restoral of access to one of the disk memories;

in response copying into the one disk memory an initial version of the processes from a tape memory included in the processing system;

swapping the initial version of essential processes from the one disk memory into the main memory; and ceasing limitation of processing while maintaining the essential processes locked in the main memory.

19. The method of claim 18 further comprising the steps of:
receiving notice of restoral of access to both disk memories;
in response copying contents of the one disk memory into the other disk memory; and
unlocking the essential processes in the main memory to enable their being swapped out from the main memory.

20. In a processing system that includes
a first and a second processor arranged in an active-inactive configuration, respectively,
each processor comprising a central processing unit for executing processes, a main memory coupled to the central processing unit for storing selected processes requested by the processing unit for use, and a first and a second direct memory access controller coupled to the main memory unit,
the processors being communicatively coupled to each other by means for selectively keeping the contents of the main memories duplicated,
the processing system further including means for reconfiguring the system,
a first and a second disk memory each for storing a copy of processes, including the selected processes, for use by the processing system, including processes designated essential to system operation, the first direct memory access controller of each processor being coupled for access to the first disk memory and the second direct memory access controller of each processor being coupled for access to the second disk memory to enable each controller to swap processes between the associated main memory and the associated disk memory, and
at least one tape memory for storing an initial version of the processes stored by the disk memories, the tape memory coupled for access to at least one of the direct memory access controllers,
a method of protecting the processing capability of the system against loss of access to both disk memories, comprising the steps of:
detecting loss of access from the active processor to the first disk memory;
in response swapping such of the essential processes as are not stored in the active processor's main memory from the second disk memory into the active processor's main memory; and
locking the essential processes into the active processor's main memory to prevent removal thereof from the active processor's main memory;
detecting loss of access from the active processor to both disk memories;
in response attempting to reconfigure the system to gain access from at least one of the processors to at least one of the disk memories;
resuming normal processing while maintaining the essential processes locked in the active processor's main memory if access to at least one of the disk memories is gained by the attempted reconfiguration;
limiting processing to the execution of the essential processes, including terminating processes not designated essential stored in the active processor's main memory, if access to at least one disk memory is not gained by the attempted reconfiguration;
receiving notice of manual restoral of access by the active processor to one of the disk memories, if access to at least one disk memory has not previously been gained by the attempted reconfiguration;
in response to the notice, copying into the one disk memory the initial version of the processes from the tape memory;
further in response to the notice, swapping the initial version of the essential processes from the one disk memory into the active processor's main memory;
further in response to the notice, ceasing limitation of processing while maintaining the essential processes locked in the active processor's main memory;
receiving notice of restoral of access to both disk memories;
in response copying contents of the one disk memory into the other disk memory; and
unlocking the essential processes from the active processor's main memory to enable their removal from the active processor's main memory.

21. The method of claim 20 wherein the step of attempting to reconfigure the system comprises the steps of:
attempting to soft switch the active and inactive processors; and
attempting to hard switch the active and inactive processors if the soft switch is not allowed.

22. The method of claim 20 wherein the step of attempting to reconfigure the system comprises the steps of:
attempting to soft switch the active and inactive processors;
determining whether the first disk memory is usable if the soft switch does not restore access to at least one of the disk memories or if the soft switch is not allowed;
swapping the first disk memory's version of the essential processes from the first disk memory into the active processor's main memory if the first disk memory is determined to be usable; and
attempting to hard switch the active and inactive processors if the soft switch is not allowed and the first disk is not usable.

23. A processing system comprising
a plurality of secondary memory means each for storing a replica of information for use by the processing system, including designated information;
main memory means for storing selected portions of the information;
means for transferring the selected portions of the information between the main memory means and the secondary memory means;
means cooperative with the transferring means for detecting loss of information transfer capability between the main memory means and a secondary memory means of the plurality of secondary memory means;
means cooperative with the transferring means and responsive to the loss-detecting means for storing all designated information in the main memory means upon loss of information transfer capability between the main memory means and all but at least one secondary memory means; and
means responsive to the loss-detecting means for preventing removal of the designated information from the main memory means upon loss of information transfer capability between the main memory means and all but at least one secondary memory means and prior to the loss-detecting means detecting loss of information transfer capability between the main memory means and the at least one secondary memory means;

said transferring means being permitted to transfer information between the main memory means and the at least one secondary memory means while the removal-preventing means are preventing removal of the designated information from the main memory means;

whereby the designated information remains available to the processing system in the main memory means upon loss of information transfer capability between the main memory means and all of the secondary memory means.

24. A processing system comprising a plurality of secondary memory means each for storing a replica of information for use by the processing system, including designated information;

main memory means for storing selected portions of the information;

means for transferring the selected portion of the information between the main memory means and the secondary memory means;

means cooperative with the transferring means for detecting loss of information transfer capability between the main memory means and a secondary memory means;

means for identifying designated information;

means for determining what information is stored in the main memory;

means cooperative with the transferring, identifying, and determining means and responsive to the loss-detecting means for causing the transferring means to transfer such designated information as is not stored in the main memory means from the at least one secondary memory means into the main memory means, to store all designated information in the main memory means, upon loss of information transfer capability between the main memory means and all but at least one secondary memory means; and means responsive to the loss-detecting means for preventing removal of the designated information from the main memory means upon loss of information transfer capability between the main memory means and all but at least one secondary memory means, to maintain the designated information available to the processing system in the main memory means upon loss of information transfer capability between the main memory means and all of the secondary memory means.

25. A processing system comprising a plurality of secondary memory means each for storing a replica of information for use by the processing system, including designated information;

main memory means for storing selected portions of the information;

means for transferring the selected portion of the information between the main memory means and the secondary memory means;

means cooperative with the transferring means for detecting loss of information transfer capability between the main memory means and a secondary memory means;

means cooperative with the transferring means and responsive to the loss-detecting means for storing all designated information in the main memory means upon loss of information transfer capability between the main memory means and all but at least one secondary memory means;

means for detecting restoral of information transfer capability between the main memory means and a secondary memory means; and means responsive to the loss-detecting means for preventing removal of the designated information from the main memory means upon loss of information transfer capability between the main memory means and all but at least one secondary memory means to maintain the designated information available to the processing system in the main memory means, upon loss of information transfer capability between the main memory means and all of the secondary memory means, the removal-preventing means further responsive to the restoral-detecting means for enabling removal of the designated information from the main memory means, upon restoral of information transfer capability between the main memory means and at least two secondary memory means.

26. A processing system comprising a plurality of secondary memory means each for storing a replica of information for use by the processing system, including designated information;

main memory means for storing selected portions of the information;

means for transferring the selected portion of the information between the main memory means and the secondary memory means;

means cooperative with the transferring means for detecting loss of information transfer capability between the main memory means and a secondary memory means;

means cooperative with the transferring means and responsive to the loss-detecting means for storing all designated information in the main memory means, upon loss of information transfer capability between the main memory means and all but at least one secondary memory means;

means responsive to the loss-detecting means for preventing removal of the designated information from the main memory means upon loss of information transfer capability between the main memory means and all but at least one secondary memory means to maintain the designated information available to the processing system in the main memory means upon loss of information transfer capability between the main memory means and all of the secondary memory means; and means responsive to the loss-detecting means for limiting system operation to the use of the designated information, upon loss of information transfer capability between the main memory means and all of the secondary memory means.

27. The system of claim 26 wherein the operation-limiting means comprise means responsive to the restoral-detecting means for ceasing limitation of system operation to the use of the designated information, upon restoral of information transfer capability between the main memory means and at least one secondary memory means.

28. The system of claim 27 wherein the removal-preventing means include means responsive to the restoral-detecting means for enabling removal of the designated information from the main memory means, upon restoral of information transfer capability between the main memory means and at least two secondary memory means.

29. A processing system tolerant of loss of access to disk memories comprising:
- a pair of disk memories each for storing a copy of processes for use by the processing system, including processes designated essential to system operation;
- a main memory for storing selected ones of the processes;
- transfer means for transferring processes between the main memory and the disk memories;
- means cooperative with the transfer means for detecting loss of process transfer capability between the main memory and a disk memory;
- means for selectively locking the designated processes into the main memory to prevent their removal from the main memory; and
- control means responsive to the loss-detecting means for causing the transfer means to transfer such designated processes as are not stored in the main memory from the other of the disk memories into the main memory and for causing the locking means to lock the designated processes into the main memory, upon detection of loss of process transfer capability between the main memory and one of the disk memories and prior to the loss-detecting means detecting loss of process transfer capability between the main memory means and the other of the disk memories, the control means further permitting the transfer means to transfer processes between the main memory and the other of the disk memories while the locking means are locking the designated processes into the main memory;
- whereby the designated processes remain available in the main memory to the processing system to continue processing therewith should process transfer capability between the main memory and both of the disk memories be lost.

30. A processing system tolerant of loss of access to disk memories, comprising:
- a pair of disk memories each for storing a copy of processes for use by the processing system, including processes designated essential to system operation;
- a main memory for storing selected ones of the processes;
- transfer means for transferring processes between the main memory and the disk memories;
- means cooperative with the transfer means for detecting loss of process transfer capability between the main memory and a disk memory;
- means for detecting restoral of process transfer capability between the main memory and a disk memory;
- means for selectively locking the designated processes into the main memory to prevent their removal from the main memory; and
- control means responsive to the loss-detecting means for causing the transfer means to transfer such designated processes as are not stored in the main memory from the other of the disk memories into the main memory and for causing the locking means to lock the designated processes into the main memory, upon detection of loss of process transfer capability between the main memory and one of the disk memories, to maintain the designated processes available in the main memory to the processing system to continue processing therewith should process transfer capability between the main memory and both of the disk memories be lost, the control means further responsive to the restoral-detecting means for causing the locking means to unlock the designated processes in the main memory to enable their transfer from the main memory, upon detection of restoral of process transfer capability between the main memory and both of the disk memories.

31. The system of claim 30 wherein
the control means comprise means responsive to the restoral-detecting means for causing the transfer means to copy the processes stored by the other of the disk memories into the one of the disk memories, upon detection of restoral of process transfer capability between the main memory and both of the disk memories.

32. A processing system tolerant of loss of access to disk memories, comprising:
- a pair of disk memories each for storing a copy of processes for use by the processing system, including processes designated essential to system operation;
- a main memory for storing selected ones of the processes;
- transfer means for transferring processes between the main memory and the disk memories;
- means cooperative with the transfer means for detecting loss of process transfer capability between the main memory and a disk memory;
- means for selectively locking the designated processes into the main memory to prevent their removal from the main memory; and
- control means responsive to the loss-detecting means for causing the transfer means to transfer such designated processes as are not stored in the main memory from the other of the disk memories into the main memory and for causing the locking means to lock the designated processes into the main memory, upon detection of loss of process transfer capability between the main memory and one of the disk memories, to maintain the designated processes available in the main memory to the processing system to continue processing therewith should process transfer capability between the main memory and both of the disk memories be lost, the control means further responsive to the loss-detecting means for limiting processing to execution of the designated processes, upon detection of loss of process transfer capability between the main memory and both of the disk memories.

33. The system of claim 32 wherein the means for limiting processing comprise:
means for terminating processes stored in the main memory that are not designated essential.

34. The system of claim 32 further comprising:
means for detecting restoral of data and program transfer capability between the main memory and a disk memory; and wherein
the means for limiting processing further comprise means responsive to the restoral-detecting means for ceasing to limit processing to execution of the designated processes, upon detection of restoral of process transfer capability between the main memory and a first of the disk memories.

35. The system of claim 34 further comprising:
a tertiary memory subsystem for storing the processes for use by the processing system;
first means responsive to the restoral-detecting means for transferring the contents of the tertiary memory means into the first of the disk memories, upon detection of restoral of process transfer capability between the main memory and the first of the disk memories; and
second means responsive to the first means for transferring the designated processes from the first of the disk memories to the main memory, upon transfer of the designated processes by the first means.

36. The system of claim 34 further comprising:
a tape memory subsystem for storing an initial version of the processes for use by the processing system; and wherein
the control means further comprise means responsive to the restoral-detecting means for causing the transfer means to transfer into the first of the disk memories the initial version of the processes from the tape memory subsystem and for causing the transfer means to replace the designated processes in the main memory with the initial version of the designated processes from the first of the disk memories, upon detection of restoral of process transfer capability between the main memory and the first of the disk memories.

37. The system of claim 34 wherein the control means further comprise:
means responsive to the restoral-detecting means for causing the locking means to unlock the designated programs and data in the main memory to enable their transfer from the main memory, upon detection of restoral of data and program transfer capability between the main memory and both of the secondary memory subsystems.

38. The system of claim 36 wherein the control means further comprise:
means responsive to the restoral-detecting means for causing the transfer means to copy the processes stored by the first of the disk memories into the second of the disk memories and for causing the locking means to unlock the designated processes in the main memory to enable their transfer from the main memory, upon detection of restoral of process transfer capability between the main memory and both of the disk memories.

* * * * *

UNITED STATES PATENT AND TRADEMARK OFFICE

CERTIFICATE OF CORRECTION

PATENT NO: 4,608,688
DATED: October 26, 1982
INVENTOR(s): Robert C. Hansen, Calvin J. Richardson and David A. Schmitt It is certified that error appears in the above-identified patent and that said Letters Patent is hereby corrected as shown below:

Column 19, line 51, "transfer of" should read --transfer--.

Column 19, line 52, "secondary capability" should read --capability--.

Column 19, line 53, "memory means" should read --of secondary memory means--.

Column 19, line 68, "process" should read --processing--.

Signed and Sealed this

Fifteenth Day of September, 1992

*Attest:*

DOUGLAS B. COMER

*Attesting Officer*   *Acting Commissioner of Patents and Trademarks*